United States Patent
Kumura et al.

(10) Patent No.: US 11,043,461 B2
(45) Date of Patent: Jun. 22, 2021

(54) SEMICONDUCTOR DEVICE HAVING AN ELECTROMAGNETIC WAVE ABSORBING THERMAL CONDUCTIVE SHEET BETWEEN A SEMICONDUCTOR ELEMENT AND A COOLING MEMBER

(71) Applicant: Dexerials Corporation, Shinagawa-ku Tokyo (JP)

(72) Inventors: Tatsuo Kumura, Tokyo (JP); Hiroyuki Ryoson, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 16/473,249

(22) PCT Filed: Nov. 22, 2017

(86) PCT No.: PCT/JP2017/042046
§ 371 (c)(1),
(2) Date: Jun. 25, 2019

(87) PCT Pub. No.: WO2018/123370
PCT Pub. Date: Jul. 5, 2018

(65) Prior Publication Data
US 2020/0152581 A1    May 14, 2020

(30) Foreign Application Priority Data
Dec. 26, 2016  (JP) .............................. JP2016-251760

(51) Int. Cl.
*H01L 23/552*  (2006.01)
*H01L 23/373*  (2006.01)
(Continued)

(52) U.S. Cl.
CPC .......... *H01L 23/552* (2013.01); *H01L 23/373* (2013.01); *H05K 7/20* (2013.01); *H05K 9/0081* (2013.01)

(58) Field of Classification Search
CPC .. H05K 9/0081; H05K 9/009; H05K 7/20472; H05K 7/20481; H01L 23/373;
(Continued)

(56) References Cited

U.S. PATENT DOCUMENTS

| 5,557,500 A | * | 9/1996 | Baucom | ................... G06F 1/203 |
| | | | | 361/679.54 |
| 5,864,088 A | * | 1/1999 | Sato | ....................... H01L 23/552 |
| | | | | 174/386 |

(Continued)

FOREIGN PATENT DOCUMENTS

| EP | 3013126 A1 * | 4/2016 | ............. H01L 24/29 |
| JP | H11150029 A | 2/1999 | |

(Continued)

OTHER PUBLICATIONS

Machine translation, Lee, Korean Pat. Pub. No. 10-2016-0004786, translation date: Jul. 17, 2020, Espacenet, all pages (Year: 2020).*

(Continued)

*Primary Examiner* — Victoria K. Hall
(74) *Attorney, Agent, or Firm* — Kenja IP Law PC

(57) ABSTRACT

Provided is a semiconductor device having excellent heat transferring performance and electromagnetic wave suppression effect. A semiconductor device 1 comprises: a semiconductor element 30 formed on a substrate 50; a conductive shield can 20 having an opening 21, covering at least a part of the semiconductor element 30, and connected to a ground 60; a cooling member 40 located above the conductive shield can 20; and an electromagnetic wave absorbing thermal conductive sheet 10 formed between the semiconductor element 30 and the cooling member 40 at least through the opening 21 of the conductive shield can 20.

7 Claims, 9 Drawing Sheets

(51) Int. Cl.
    *H05K 7/20* (2006.01)
    *H05K 9/00* (2006.01)

(58) Field of Classification Search
    CPC ............ H01L 23/3733; H01L 23/3735; H01L
               23/3736; H01L 23/3737; H01L 23/552
    See application file for complete search history.

(56) References Cited

U.S. PATENT DOCUMENTS

| | | | | |
|---|---|---|---|---|
| 6,487,073 | B2* | 11/2002 | McCullough | G06F 1/203 |
| 9,224,672 | B1* | 12/2015 | Pykari | H01L 23/373 |
| 9,363,884 | B2* | 6/2016 | Yang | H01L 23/552 |
| 9,854,664 | B2* | 12/2017 | Brey | H05K 5/0221 |
| 9,978,661 | B2* | 5/2018 | Im | H01L 25/50 |
| 10,660,194 | B2* | 5/2020 | Ito | H05K 1/0204 |
| 10,699,985 | B2* | 6/2020 | Chung | H05K 7/20 |
| 10,798,849 | B2* | 10/2020 | Lee | F28D 15/0275 |
| 10,893,637 | B2* | 1/2021 | Lee | H05K 9/0022 |
| 10,957,620 | B2* | 3/2021 | Chung | H05K 1/0203 |
| 2002/0064024 | A1* | 5/2002 | McCullough | H05K 9/0022 |
| | | | | 361/679.54 |
| 2003/0183909 | A1* | 10/2003 | Chiu | H01L 23/42 |
| | | | | 257/667 |
| 2003/0193794 | A1* | 10/2003 | Reis | H05K 9/003 |
| | | | | 361/816 |
| 2004/0175875 | A1* | 9/2004 | Sung | H01L 23/3733 |
| | | | | 438/197 |
| 2004/0262372 | A1* | 12/2004 | Houle | H01L 23/433 |
| | | | | 228/246 |
| 2005/0012652 | A1* | 1/2005 | Wakayama | H01F 1/18 |
| | | | | 342/1 |
| 2005/0116336 | A1* | 6/2005 | Chopra | H01L 23/373 |
| | | | | 257/720 |
| 2009/0178843 | A1* | 7/2009 | Kato | H01L 23/552 |
| | | | | 174/391 |
| 2012/0228018 | A1* | 9/2012 | McBain | H05K 9/0083 |
| | | | | 174/350 |
| 2013/0133942 | A1* | 5/2013 | Kandoor | H05K 9/0088 |
| | | | | 174/388 |
| 2015/0163958 | A1* | 6/2015 | Oguma | H05K 7/20463 |
| | | | | 264/36.22 |
| 2015/0216084 | A1* | 7/2015 | Huang | H01L 23/3735 |
| | | | | 361/719 |
| 2016/0301442 | A1* | 10/2016 | Sohn | H04M 1/19 |
| 2017/0094831 | A1* | 3/2017 | Khorrami | H05K 9/0081 |
| 2018/0228063 | A1* | 8/2018 | Dixon | H01L 23/552 |
| 2021/0020542 | A1* | 1/2021 | Kumura | H01L 23/552 |

FOREIGN PATENT DOCUMENTS

| | | | | |
|---|---|---|---|---|
| JP | 2001335602 | A | | 12/2001 |
| JP | 2001345407 | A | | 12/2001 |
| JP | 2002164689 | A | | 6/2002 |
| JP | 2002184916 | A | | 6/2002 |
| JP | 2003142876 | A | | 5/2003 |
| JP | 2006059998 | A | | 3/2006 |
| JP | 2006513556 | A | | 4/2006 |
| JP | 2009252886 | A | | 10/2009 |
| JP | 2011091095 | A | | 5/2011 |
| JP | 2011155056 | A | | 8/2011 |
| JP | 2014027144 | A | | 2/2014 |
| JP | 2014239236 | A | | 12/2014 |
| JP | 2016143815 | A | | 8/2016 |
| KR | 1020160004786 | A | | 1/2016 |
| KR | 10-1760313 | B1 | * | 7/2017 ............ C01B 31/04 |
| KR | 10-1860236 | B1 | * | 5/2018 ............ H05K 7/20 |
| WO | WO-0141521 | A1 | * | 6/2001 ............ H05K 9/0022 |
| WO | WQ-2010002896 | A1 | * | 1/2010 ............ C01B 32/182 |
| WO | WO-2013187298 | A1 | * | 12/2013 ......... H01L 23/3737 |
| WO | 2014080931 | A1 | | 5/2014 |
| WO | 2016144039 | A1 | | 9/2016 |
| WO | 2016188217 | A1 | | 12/2016 |

OTHER PUBLICATIONS

Laird, Hybrid Thermal Transfer/EMI Absorber CoolZorb 400 Series, downloaded Nov. 2020, Laird, all pages (Year: 2020).*
Machine translation, Yang, Korean Pat. Pub. No. KR 10-1860236, translation date: Nov. 18, 2020, Espacenet, all pages (Year: 2020).*
Machine translation, Park, Korean Pat. Pub. No. KR 10-1760313, translation date: Nov. 18, 2020, Espacenet, all pages (Year: 2020).*
Apr. 24, 2018, Notification of Reasons for Refusal issued by the Japan Patent Office in the corresponding Japanese Patent Application No. 2016-251760.
Jan. 30, 2018, International Search Report issued in the International Patent Application No. PCT/JP2017/042046.
Jun. 27, 2019, International Preliminary Report on Patentability issued in the International Patent Application No. PCT/JP2017/042046.
Nov. 16, 2020, Office Action issued by the Taiwan Intellectual Property Office in the corresponding Taiwanese Patent Application No. 106142361.

* cited by examiner

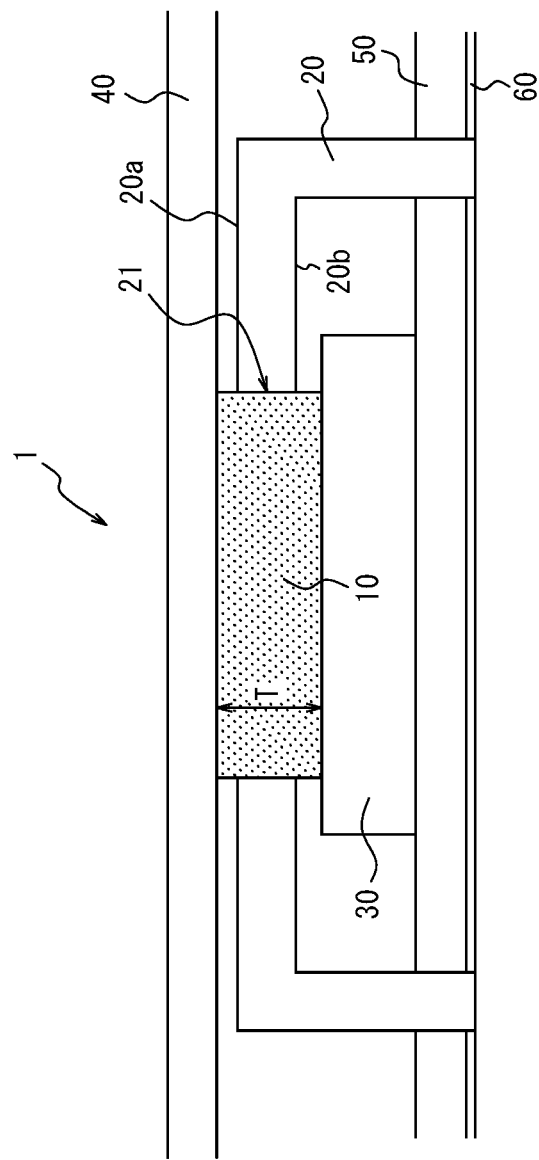

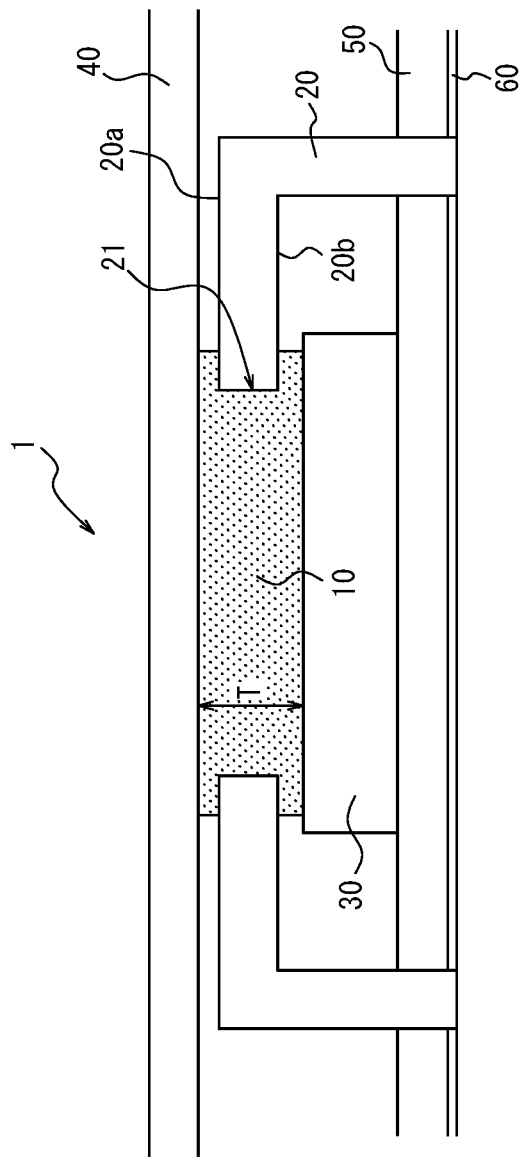

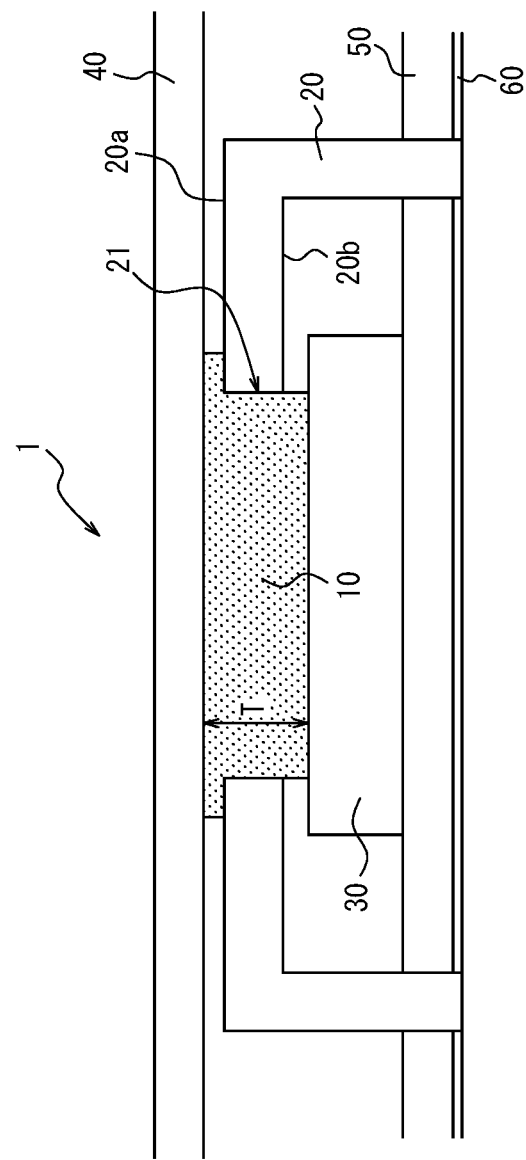

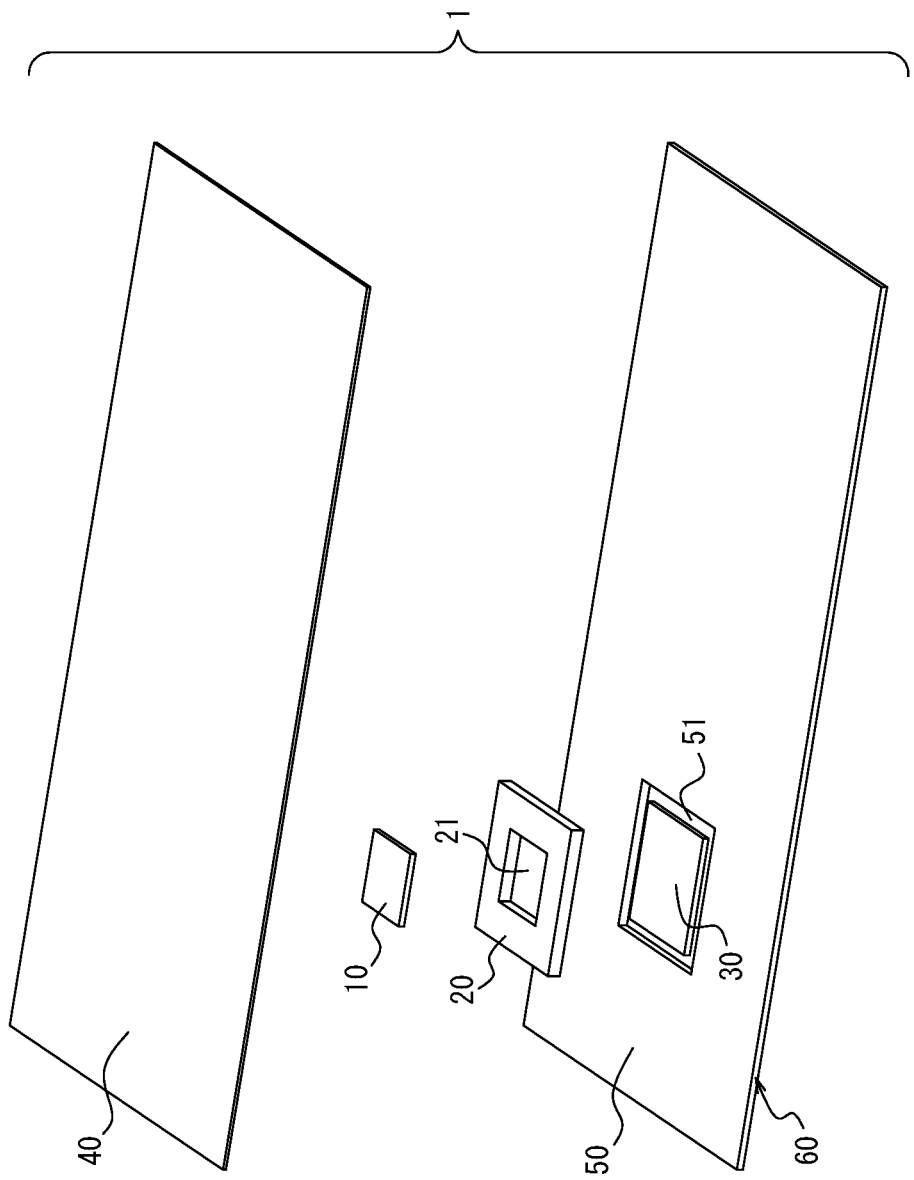

SEMICONDUCTOR DEVICE HAVING AN ELECTROMAGNETIC WAVE ABSORBING THERMAL CONDUCTIVE SHEET BETWEEN A SEMICONDUCTOR ELEMENT AND A COOLING MEMBER

TECHNICAL FIELD

The present disclosure relates to a semiconductor device having excellent heat transferring performance and electromagnetic wave suppression effect.

BACKGROUND

Recent years have seen size reductions of electronic devices. Meanwhile, because power consumption cannot be significantly changed in order to cover a variety of applications, thermal solutions for the devices have become more important.

As thermal solutions for electronic devices, for example, heat spreading plates, heat pipes, and heatsinks made of metallic material having high thermal conductivity such as copper or aluminum are widely used. Such a heat transferring component with excellent thermal conductivity is located near an electronic component, such as a semiconductor package, which is a heating portion in an electronic device, to achieve heat transferring effect or temperature relaxation in the device. The thermal conductive component with excellent thermal conductivity is also located from the electronic component as the heating portion through to a low-temperature region.

However, this causes the following problem: The heating portion in the electronic device is an electronic component such as a semiconductor element with high current density, and high current density means that the strength of an electric field or a magnetic field which can cause an unwanted transferring factor is likely to be high. If the heat transferring component made of metal is located near the electronic component, the heat transferring component not only absorbs heat, but also picks up a harmonic component of an electric signal flowing in the electronic component. Specifically, since the heat transferring component is made of metallic material, the heat transferring component acts as an antenna for the harmonic component or acts as a transmission path for the harmonic noise component.

The development of techniques to achieve both heat transferring performance and electromagnetic wave suppression effect is therefore desirable.

For example, PTL 1 discloses a structure that includes a heat sink fin and a shield case having a hole for the fin and covering an electronic component mounted on a printed substrate and in which part of the heat sink fin is exposed from the hole for the fin to outside the shield case.

With the technique described in PTL 1, heat transferring performance can be ensured to some extent, but sufficient electromagnetic wave suppression effect cannot be achieved due to the hole for the fin formed in the shield case. Thus, it is impossible to achieve both heat transferring performance and electromagnetic wave suppression effect.

CITATION LIST

Patent Literature

PTL 1: JP 2011-155056 A

SUMMARY

Technical Problem

It could therefore be helpful to provide a semiconductor device having excellent heat transferring performance and electromagnetic wave suppression effect.

Solution to Problem

Through extensive studies, we recognized that excellent electromagnetic wave absorption performance can be achieved by covering a semiconductor element with a conductive shield can connected to a ground. However, simply providing such a shield can cannot achieve sufficient heat transferring performance. We accordingly conducted further studies, and discovered that, by forming an opening in the conductive shield can and forming an electromagnetic wave absorbing thermal conductive sheet so as to at least pass through the opening to connect the semiconductor element and a cooling member, heat transferring performance can be improved without a decrease in electromagnetic wave absorption performance. Hence, a semiconductor device according to the present disclosure can achieve both heat transferring performance and electromagnetic wave suppression effect at higher level than conventional techniques.

The present disclosure is based on these discoveries. We thus provide:

(1) A semiconductor device comprising: a semiconductor element formed on a substrate; a conductive shield can having an opening, covering at least a part of the semiconductor element, and connected to a ground; a cooling member located above the conductive shield can; and an electromagnetic wave absorbing thermal conductive sheet formed between the semiconductor element and the cooling member at least through the opening of the conductive shield can.

With such a structure, excellent heat transferring performance and electromagnetic wave suppression effect can be achieved.

(2) The semiconductor device according to (1), wherein the electromagnetic wave absorbing thermal conductive sheet covers part of at least one of an upper surface and a lower surface of the conductive shield can.

(3) The semiconductor device according to (2), wherein the electromagnetic wave absorbing thermal conductive sheet covers part of the upper surface of the conductive shield can.

(4) The semiconductor device according to (2), wherein the electromagnetic wave absorbing thermal conductive sheet covers part of each of the upper surface and the lower surface of the conductive shield can.

(5) The semiconductor device according to (2), wherein a covering area of the electromagnetic wave absorbing thermal conductive sheet is 110% or more of an area of the opening of the conductive shield can.

(6) The semiconductor device according to any one of (1) to (5), wherein the electromagnetic wave absorbing thermal conductive sheet is made up of a plurality of sheets.

(7) The semiconductor device according to any one of (1) to (6), wherein the electromagnetic wave absorbing thermal conductive sheet contains fibrous thermal conductive fillers.

(8) The semiconductor device according to (7), wherein the fibrous thermal conductive fillers are carbon fibers.

(9) The semiconductor device according to (7) or (8), wherein the electromagnetic wave absorbing thermal conductive sheet further contains magnetic metal powders.

(10) The semiconductor device according to any one of (1) to (9), wherein the electromagnetic wave absorbing thermal conductive sheet has higher thermal conductivity in a sheet central portion than in a sheet peripheral portion.

Advantageous Effect

It is thus possible to provide a semiconductor device having excellent heat transferring performance and electromagnetic wave suppression effect.

BRIEF DESCRIPTION OF THE DRAWINGS

In the accompanying drawings:

FIG. 1 is a sectional view schematically illustrating an embodiment of a semiconductor device according to the present disclosure;

FIG. 2 is a sectional view schematically illustrating another embodiment of a semiconductor device according to the present disclosure;

FIG. 3 is a sectional view schematically illustrating another embodiment of a semiconductor device according to the present disclosure;

FIG. 4 is a perspective view schematically illustrating an assembly state of an embodiment of a semiconductor device according to the present disclosure;

DETAILED DESCRIPTION

Figure 5A:
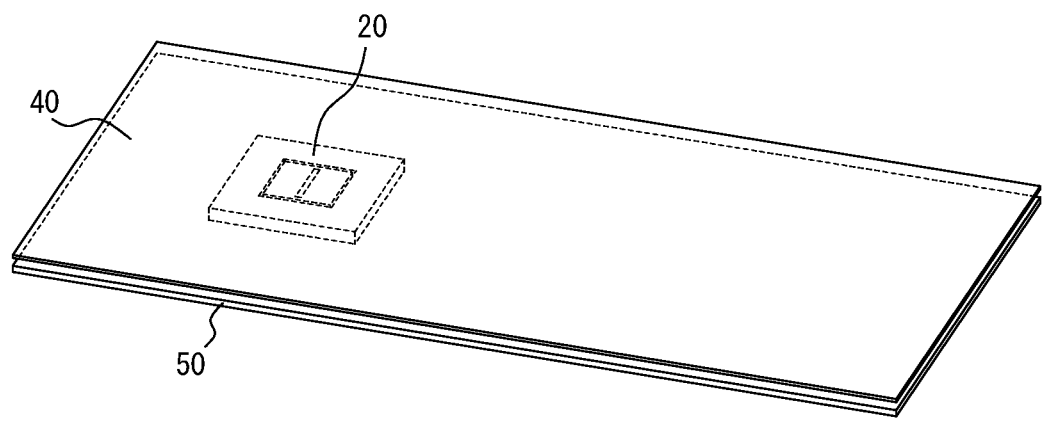
FIG. 5A is a top view schematically illustrating a model of a semiconductor device used in analysis of frequency characteristics in examples.

Embodiments of the present disclosure will be described in detail below, with reference to drawings.

FIGS. 1 to 3 are sectional views schematically illustrating three embodiments of a semiconductor device according to the present disclosure. In each drawing, the shape and scale of each member are different from actual shape and scale, for convenience's sake. The shape and scale of each member may be changed as appropriate for each semiconductor device, excluding limitations stated herein.

A semiconductor device 1 according to the present disclosure includes a semiconductor element 30, a conductive shield can 20, a cooling member 40, and an electromagnetic wave absorbing thermal conductive sheet 10, as illustrated in FIGS. 1 to 3.

In the semiconductor device 1 according to the present disclosure, the conductive shield can 20 has an opening 21, and the electromagnetic wave absorbing thermal conductive sheet 10 is formed between the semiconductor element 30 and the cooling member 40 through the opening 21.

The semiconductor element 30 is a source of heat and electromagnetic waves. However, by covering the semiconductor element 30 with the conductive shield can 20, electromagnetic waves can be shielded, thus achieving excellent electromagnetic wave suppression effect. Moreover, by forming the opening 21 in the conductive shield can 20 and providing the sheet member (electromagnetic wave absorbing thermal conductive sheet 10) having electromagnetic wave absorption performance and high thermal conductivity between the semiconductor element 30 and the cooling member 40 at least through the opening 21, thermal conduction to the cooling member 40 is significantly improved while maintaining the electromagnetic wave suppression effect even in the case where the opening 21 is formed. Hence, excellent heat transferring performance can be achieved, too.

Figure 9:
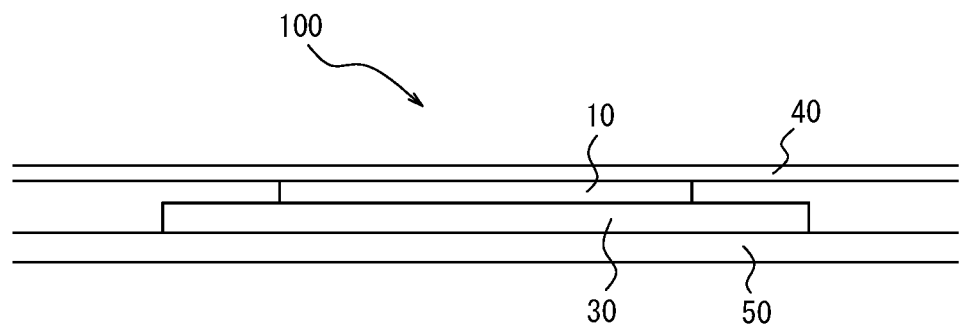
FIG. 9 is a sectional view schematically illustrating a conventional semiconductor device.

FIG. 9 illustrates an example of a conventional semiconductor device including an electromagnetic wave absorbing thermal conductive sheet. In a conventional semiconductor device 100, an electromagnetic wave absorbing thermal conductive sheet 10 is provided between a semiconductor element 30 and a cooling member 40, so that excellent thermal conductivity and electromagnetic wave absorption effect can be achieved. However, since there is no electromagnetic wave shielding material such as the shield can 20 in the semiconductor device 1 according to the present disclosure, it is difficult to achieve sufficient electromagnetic wave suppression effect.

Each member included in the semiconductor device according to the present disclosure will be described below.

(Semiconductor Element)

The semiconductor device 1 according to the present disclosure includes the semiconductor element 30 formed on a substrate 50, as illustrated in FIGS. 1 to 3.

The semiconductor element is not limited, as long as it is an electronic component formed by semiconductor. Examples include integrated circuits such as IC and LSI, CPUs, MPUs, graphic arithmetic elements, and image sensors.

The substrate 50 on which the semiconductor element 30 is formed is not limited, and a suitable substrate may be used depending on the type of the semiconductor device. The substrate 50 is provided with a ground (GND) 60. The ground 60 is formed inside or on the back of the substrate 50 (on the back of the substrate in FIGS. 1 to 3).

FIGS. 1 to 3 illustrate an example in which the conductive shield can 20 passes through the substrate 50 and is directly connected to the ground 60, for the sake of convenience. In typical practical use, however, a land 51 is provided on the surface of the substrate 50 so as to wholly or partially surround the semiconductor element 30, and the conductive shield can 20 is connected to this part using solder or the like, as illustrated in FIG. 4. The land 51 is electrically connected to the ground 60 via a through hole (not illustrated) formed in the substrate 50. Thus, the conductive shield can 20 is electrically joined to the ground 60.

(Shield can)

The semiconductor device 1 according to the present disclosure includes the conductive shield can 20 having the opening 21, covering at least a part of the semiconductor element 30, and connected to the ground 60, as illustrated in FIGS. 1 to 3.

The conductive shield can 20 connected to the ground 60 can shield electromagnetic waves. This improves the electromagnetic wave suppression effect of the semiconductor device 1 according to the present disclosure.

The material forming the shield can 20 is not limited, as long as it has high electromagnetic wave shielding effect. Examples include highly conductive metals such as aluminum, copper, and stainless steel, and highly conductive magnetic materials. Examples of the highly conductive magnetic materials include Permalloy, Sendust, Fe-based or Co-based amorphous material, and microcrystalline material. In the case where such magnetic material is used as the material forming the shield can 20, not only electric shielding effect but also magnetic shielding effect and magnetic absorption effect can be expected.

The opening 21 in the shield can is a through hole formed in the shield can. The opening 21 is formed in a direction connecting the semiconductor element 30 and the cooling member 40 (the lamination direction of the members in FIGS. 1 to 3) as illustrated in FIGS. 1 to 3, because the opening 21 is filled with the below-described electromagnetic wave absorbing thermal conductive sheet 10 to connect the semiconductor element 30 and the cooling member 40.

The size of the opening 21 is not limited, and may be changed as appropriate depending on the size of the semiconductor element 30 and the like. When the opening area of the opening 21 is smaller, the emission of electromagnetic waves can be reduced, and radiated electromagnetic field can be reduced. In terms of releasing heat from the semiconductor element 30, on the other hand, it is preferable to form a larger opening 21 and use a larger electromagnetic wave absorbing thermal conductive sheet 10. Therefore, the size of the opening 21 is changed as appropriate depending on the thermal conductivity and electromagnetic noise suppression effect required of the semiconductor device 1 according to the present disclosure.

(Cooling Member)

The semiconductor device 1 according to the present disclosure includes the cooling member 40 above the conductive shield can 20, as illustrated in FIGS. 1 to 3.

The cooling member 40 is a member for absorbing heat generated from the heat source (semiconductor element 30) and dissipating it to the outside. As a result of being connected to the semiconductor element 30 through the below-described electromagnetic wave absorbing thermal conductive sheet 10, the cooling member 40 can diffuse heat generated from the semiconductor element 30 to the outside, thus ensuring the heat transferring performance of the semiconductor device.

The type of the cooling member 40 is not limited, and may be selected as appropriate depending on the type of the semiconductor device 1 according to the present disclosure. Examples include a radiator, a cooler, a heatsink, a heat spreader, a die pad, a cooling fan, a heat pipe, a metallic cover, and a cabinet. Of these cooling members, a radiator, a cooler, or a heatsink is preferable because higher heat transferring performance can be achieved.

While the cooling member 40 is located above the conductive shield can 20, preferably the cooling member 40 is not in contact with the conductive shield can and is at a predetermined distance from the conductive shield can, as illustrated in FIGS. 1 to 3. This is because the below-described electromagnetic wave absorbing thermal conductive sheet 10 may be provided between the upper surface 20a of the conductive shield can 20 and the cooling member 40.

(Electromagnetic Wave Absorbing Thermal Conductive Sheet)

The semiconductor device 1 according to the present disclosure includes the electromagnetic wave absorbing thermal conductive sheet 10 formed between the semiconductor element 30 and the cooling member 40 at least through the opening 21 of the conductive shield can 20, as illustrated in FIGS. 1 to 3.

As a result of providing the electromagnetic wave absorbing thermal conductive sheet 10 having electromagnetic wave absorption performance and high thermal conductivity between the semiconductor element 30 and the cooling member 40, heat transferring performance can be improved without a decrease in electromagnetic wave suppression effect.

Figure 10:
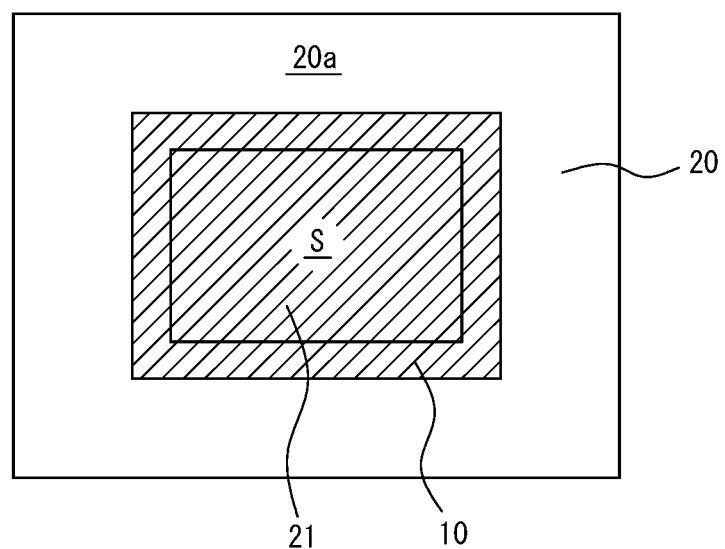
FIG. 10 is a top view schematically illustrating a conductive shield can and an electromagnetic wave absorbing thermal conductive sheet.

The size of the electromagnetic wave absorbing thermal conductive sheet 10 is not limited, but the electromagnetic wave absorbing thermal conductive sheet 10 needs to have a covering area larger than or equal to the area of the opening because the opening 21 of the shield can 20 is filled with the electromagnetic wave absorbing thermal conductive sheet 10 as illustrated in FIGS. 1 to 3. FIG. 10 illustrates the electromagnetic wave absorbing thermal conductive sheet and the conductive shield can as seen from above. Herein, the covering area of the electromagnetic wave absorbing thermal conductive sheet 10 refers to the area (the diagonally shaded area S in FIG. 10) of the shield can 20 (including the opening 21) covered with the electromagnetic wave absorbing thermal conductive sheet 10, as illustrated in FIG. 10. In the case where the electromagnetic wave absorbing thermal conductive sheet 10 covers both the upper surface 20a and the lower surface 20b of the conductive shield can, the covering area denotes not the total area but the covering area on each surface.

The electromagnetic wave absorbing thermal conductive sheet 10 preferably covers part of the upper surface 20a and/or the lower surface 20b of the conductive shield can 20 (i.e. the covering area of the electromagnetic wave absorbing thermal conductive sheet 10 is larger than the area of the opening 21 of the conductive shield can 20), as illustrated in FIG. 2 or 3. This achieves higher heat transferring performance and electromagnetic wave suppression effect.

Herein, the upper surface 20a of the conductive shield can 20 refers to the surface of the conductive shield can 20 on the cooling member 40 side, and the lower surface 20b of the conductive shield can 20 refers to the surface of the conductive shield can 20 on the semiconductor element 30 side, as illustrated in FIGS. 1 to 3.

In terms of achieving even higher heat transferring performance and electromagnetic wave suppression effect, the electromagnetic wave absorbing thermal conductive sheet 10 preferably covers part of the upper surface 20a of the conductive shield can 20 (i.e. the covering area of the electromagnetic wave absorbing thermal conductive sheet on the cooling member 40 side of the conductive shield can 20 is larger than the area of the opening 21 of the conductive shield can 20), as illustrated in FIG. 3.

In terms of achieving particularly higher electromagnetic wave suppression effect, the electromagnetic wave absorbing thermal conductive sheet 10 preferably covers part of each of the upper surface 20a and the lower surface 20b of the conductive shield can 20 (i.e. the covering area of the electromagnetic wave absorbing thermal conductive sheet on each of the cooling member 40 side and the semiconductor element 30 side of the conductive shield can 20 is larger than the area of the opening 21 of the conductive shield can 20), as illustrated in FIG. 2.

The covering area of the electromagnetic wave absorbing thermal conductive sheet 10 is preferably 110% or more, more preferably 120% or more, and further preferably 140% or more of the area of the opening 21 of the conductive shield can 20, in terms of achieving higher heat transferring performance and electromagnetic wave suppression effect. No upper limit is placed on the covering area of the electromagnetic wave absorbing thermal conductive sheet 10, but the upper limit is substantially the whole area of the shield can 20.

The electromagnetic wave absorbing thermal conductive sheet 10 may be made up of a single sheet, or made up of a plurality of sheets.

For example, in the case where the electromagnetic wave absorbing thermal conductive sheet 10 does not cover the upper surface 20a or the lower surface 20b of the shield can 20 (i.e. the covering area of the electromagnetic wave absorbing thermal conductive sheet 10 is equal to the area of the opening 21) as illustrated in FIG. 1, the electromagnetic wave absorbing thermal conductive sheet 10 may be made up of a single sheet. Alternatively, the electromagnetic wave absorbing thermal conductive sheet 10 may be made up of a plurality of sheets, for example to easily adjust the sheet thickness.

In the case where the electromagnetic wave absorbing thermal conductive sheet 10 covers part of the upper surface 20a and/or the lower surface 20b of the shield can 20 (i.e. the covering area of the electromagnetic wave absorbing thermal conductive sheet 10 is larger than the area of the opening 21 of the shield can 20) as illustrated in FIGS. 2 and 3, the electromagnetic wave absorbing thermal conductive sheet 10 may be made up of a single sheet, or made up of a plurality of sheets. In the case where the electromagnetic wave absorbing thermal conductive sheet 10 is made up of a single sheet, by pressure joining the electromagnetic wave absorbing thermal conductive sheet 10 and the member (the semiconductor element 30 and the cooling member 40 in FIGS. 2 and 3), part of the sheet can be pushed out to cover part of the upper surface 20a and/or the lower surface 20b of the shield can 20. In the case where the electromagnetic wave absorbing thermal conductive sheet 10 is made up of a plurality of sheets, the electromagnetic wave absorbing thermal conductive sheet 10 of a desired shape can be obtained by combining sheets of different sizes.

In the case where the electromagnetic wave absorbing thermal conductive sheet 10 covers part of the upper surface 20a and/or the lower surface 20b of the shield can 20 (i.e. the covering area of the electromagnetic wave absorbing thermal conductive sheet 10 is larger than the area of the opening 21 of the shield can 20) as illustrated in FIGS. 2 and 3, the electromagnetic wave absorbing thermal conductive sheet 10 is preferably made up of a plurality of sheets. Since a process such as pressure joining is not necessary, the electromagnetic wave absorbing thermal conductive sheet 10 can be formed in a state in which the below-described fibrous thermal conductive fillers are oriented, as a result of which higher heat transferring performance and electromagnetic wave suppression effect can be achieved.

The thickness T of the electromagnetic wave absorbing thermal conductive sheet 10 is not limited, and may be changed as appropriate depending on the distance between the semiconductor element 30 and the cooling member 40, the size of the shield can 20, and the like. In terms of achieving higher heat transferring performance and electromagnetic wave suppression effect, the thickness T of the electromagnetic wave absorbing thermal conductive sheet 10 is preferably 50 μm to 4 mm, more preferably 100 μm to 4 mm, and particularly preferably 200 μm to 3 mm. If the thickness T of the electromagnetic wave absorbing thermal conductive sheet 10 is more than 4 mm, the distance between the semiconductor element 30 and the cooling member 40 is longer, which is likely to cause a decrease in heat transfer characteristics. If the thickness T of the electromagnetic wave absorbing thermal conductive sheet 10 is less than 50 μm, the electromagnetic wave suppression effect is likely to decrease.

Herein, the thickness T of the electromagnetic wave absorbing thermal conductive sheet 10 refers to the thickness T of the thickest part of the electromagnetic wave absorbing thermal conductive sheet 10 as illustrated in FIGS. 1 to 3, regardless of whether the electromagnetic wave absorbing thermal conductive sheet 10 is made up of a single sheet or a plurality of sheets.

The electromagnetic wave absorbing thermal conductive sheet 10 preferably has tackiness at its surface. This enhances the adhesiveness between the electromagnetic wave absorbing thermal conductive sheet 10 and the other member. Moreover, in the case where the electromagnetic wave absorbing thermal conductive sheet 10 is made up of a plurality of sheets, the adhesiveness between the sheets can be enhanced.

The method of imparting tackiness to the surface of the electromagnetic wave absorbing thermal conductive sheet 10 is not limited. For example, tackiness may be imparted by adjusting the below-described binder resin forming the electromagnetic wave absorbing thermal conductive sheet 10. Alternatively, an adhesion layer having tackiness may be provided on the surface of the electromagnetic wave absorbing thermal conductive sheet 10.

Furthermore, as a result of the electromagnetic wave absorbing thermal conductive sheet 10 having higher thermal conductivity in a sheet central portion than in a sheet peripheral portion, the thermal conductivity of the part of the electromagnetic wave absorbing thermal conductive sheet 10 in contact with the semiconductor element 30 can be increased. In the sheet peripheral portion in which the contact area with the semiconductor element 30 is smaller, electromagnetic wave absorption performance can be prioritized over thermal conductivity. Consequently, the semiconductor device 1 according to the present disclosure can achieve higher heat transferring performance and electromagnetic wave suppression effect.

Herein, the sheet central portion of the electromagnetic wave absorbing thermal conductive sheet 10 is the part of the electromagnetic wave absorbing thermal conductive sheet 10 in contact with the semiconductor element 30, and in particular the part corresponding to the part with a high heating value (commonly called a hot spot). The sheet peripheral portion is the part of the electromagnetic wave absorbing thermal conductive sheet 10 other than the central portion.

The method of changing the thermal conductivity of the electromagnetic wave absorbing thermal conductive sheet 10 is not limited. For example, the thermal conductivity can be changed by changing the material, blending quantity, and/or orientation direction of the fibrous thermal conductive filler between the sheet central portion and the sheet peripheral portion as described later.

The material forming the electromagnetic wave absorbing thermal conductive sheet 10 is not limited, as long as it has excellent electromagnetic wave absorption performance and thermal conductivity.

For example, in terms of achieving high electromagnetic wave absorption performance and thermal conductivity, an electromagnetic wave absorbing thermal conductive sheet containing a binder resin and a thermal conductive filler may be used.

The material forming the electromagnetic wave absorbing thermal conductive sheet 10 will be described below.

Binder Resin

The binder resin contained in the electromagnetic wave absorbing thermal conductive sheet is a resin component as a base material of the thermal conductive sheet. The type of the binder resin is not limited, and a known binder resin may be selected as appropriate. An example of the binder resin is thermosetting resin.

Examples of the thermosetting resin include cross-linkable rubber, epoxy resin, polyimide resin, bismaleimide resin, benzocyclobutene resin, phenol resin, unsaturated polyester, diallyl phthalate resin, silicone, polyurethane, polyimide silicone, thermosetting polyphenylene ether, and thermosetting modified polyphenylene ether. These may be used alone or in combination of two or more.

Examples of the cross-linkable rubber include natural rubber, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, fluororubber, urethane rubber, acrylic rubber, polyisobutylene rubber, and silicone rubber. These may be used alone or in combination of two or more.

Of these thermosetting resins, silicone is preferable in terms of excellent formability and weather resistance and also in terms of adhesiveness and followability to the electronic component. The silicone is not limited, and the type of the silicone may be selected as appropriate depending on the purpose.

In terms of formability, weather resistance, adhesiveness, etc., silicone containing a main ingredient of a liquid silicone gel and a hardener is preferable. Examples of such silicone include addition reaction type liquid silicone, and hot vulcanization millable type silicone with a peroxide used for vulcanization.

As the addition reaction type liquid silicone, for example, two-component addition reaction type silicone containing, as the main ingredient, polyorganosiloxane having a vinyl group and, as the hardener, polyorganosiloxane having a Si—H group is preferable.

In the combination of the main ingredient of the liquid silicone gel and the hardener, the blending proportion of the main ingredient and the hardener (main ingredient:hardener) is preferably 35:65 to 65:35 in mass ratio.

The content of the binder resin in the electromagnetic wave absorbing thermal conductive sheet is not limited, and may be selected as appropriate depending on the purpose. For example, in terms of ensuring the formability of the sheet and the adhesiveness of the sheet, the content of the binder resin is preferably about 20 vol % to 50 vol % and more preferably 30 vol % to 40 vol % of the electromagnetic wave absorbing thermal conductive sheet.

Thermal Conductive Filler

The electromagnetic wave absorbing thermal conductive sheet contains the thermal conductive filler in the binder resin. The thermal conductive fillers are a component for improving the thermal conductivity of the sheet.

The type of the thermal conductive filler is not limited. In terms of achieving higher thermal conductivity, a fibrous thermal conductive filler is preferable.

The term "fibrous" of the fibrous thermal conductive filler refers to a shape with a high aspect ratio (approximately 6 or more). Accordingly, in the present disclosure, the "fibrous thermal conductive filler" encompasses, for example, not only fibrous and bar-shaped thermal conductive fillers but also particulate fillers and flaky thermal conductive fillers that are high in aspect ratio.

The type of the fibrous thermal conductive filler is not limited, as long as it is a fibrous material with high thermal conductivity. Examples include metals such as silver, copper, and aluminum, ceramics such as alumina, aluminum nitride, silicon carbide, and graphite, and carbon fibers.

Of these fibrous thermal conductive fillers, carbon fibers are preferable in terms of achieving higher thermal conductivity.

These thermal conductive fillers may be used alone or in a mixture of two or more. In the case of using two or more thermal conductive fillers, the thermal conductive fillers may all be fibrous thermal conductive fillers, or fibrous thermal conductive fillers may be mixed with a thermal conductive filler of another shape.

The type of the carbon fibers is not limited, and may be selected as appropriate depending on the purpose. Examples include pitch-based carbon fibers, PAN-based carbon fibers, carbon fibers obtained by graphitizing PBO fibers, and carbon fibers synthesized by methods such as arc discharge, laser evaporation, chemical vapor deposition (CVD), and catalytic chemical vapor deposition (CCVD). Of these, carbon fibers obtained by graphitizing PBO fibers and pitch-based carbon fibers are more preferable, in terms of achieving high thermal conductivity.

The carbon fibers may be wholly or partly surface-treated according to need. Examples of the surface treatment include oxidation, nitriding, nitration, sulfonation, and treatment of adhering or coupling, to a functional group introduced to the surfaces by any of such treatments or the surfaces of the carbon fibers, a metal, a metal compound, an organic compound, or the like. Examples of the functional group include hydroxyl group, carboxyl group, carbonyl group, nitro group, and amino group.

The average fiber length (average major axis length) of the fibrous thermal conductive filler is not limited, and may be selected as appropriate. In terms of ensuring high thermal conductivity, the average fiber length is preferably in a range of 50 μm to 300 μm, more preferably in a range of 75 μm to 275 μm, and particularly preferably in a range of 90 μm to 250 μm.

The average fiber diameter (average minor axis length) of the fibrous thermal conductive filler is not limited, and may be selected as appropriate. In terms of ensuring high thermal conductivity, the average fiber diameter is preferably in a range of 4 μm to 20 μm, and more preferably in a range of 5 μm to 14 μm.

The aspect ratio (average major axis length/average minor axis length) of the fibrous thermal conductive filler is 6 or more, and is preferably 7 to 30, in terms of ensuring high thermal conductivity. Even in the case where the aspect ratio is low, an effect of improving thermal conductivity and the like is obtained. However, the characteristics improving effect is not significant as, for example, the orientation property decreases. The aspect ratio is therefore set to 6 or more. If the aspect ratio is more than 30, the dispersibility in the electromagnetic wave absorbing thermal conductive sheet decreases, as a result of which sufficient thermal conductivity is unlikely to be achieved.

Herein, the average major axis length and the average minor axis length of the fibrous thermal conductive filler can each be calculated from a plurality of samples measured using, for example, a microscope or a scanning electron microscope (SEM).

The content of the fibrous thermal conductive filler in the electromagnetic wave absorbing thermal conductive sheet is not limited, and may be selected as appropriate depending on the purpose. The content is preferably 4 vol % to 40 vol %, more preferably 5 vol % to 30 vol %, and particularly preferably 6 vol % to 20 vol %. If the content is less than 4 vol %, it may be difficult to obtain sufficiently low heat resistance. If the content is more than 40 vol %, the formability of the thermal conductive sheet and the orientation property of the fibrous thermal conductive filler are likely to be affected.

In the electromagnetic wave absorbing thermal conductive sheet, the thermal conductive fillers are preferably oriented in one or more directions. As a result of orienting the thermal conductive filler, higher thermal conductivity and electromagnetic wave absorbency can be achieved.

For example, to enhance the thermal conductivity by the electromagnetic wave absorbing thermal conductive sheet and improve the heat transferring performance of the semiconductor device according to the present disclosure, the thermal conductive filler may be oriented in a direction substantially perpendicular to the sheet surface. To enhance the electromagnetic wave shielding performance by the electromagnetic wave absorbing thermal conductive sheet and improve the electromagnetic wave suppression effect of the semiconductor device according to the present disclosure, the thermal conductive filler may be oriented in a direction substantially parallel to the sheet surface.

Herein, the direction substantially perpendicular to the sheet surface and the direction substantially parallel to the sheet surface refer to a direction approximately perpendicular to the sheet surface direction and a direction approximately parallel to the sheet surface direction, respectively. Since the orientation direction of the thermal conductive filler varies to some extent in manufacture, a deviation of about ±20° from the direction perpendicular to the sheet surface direction or the direction parallel to the sheet surface direction is acceptable in the present disclosure.

The method of adjusting the orientation angle of the thermal conductive filler is not limited. For example, the orientation can be adjusted by forming a sheet base formed product served as a base of the thermal conductive sheet body, and adjusting the angle for cutting out the thermal conductive sheet body with the particles of the fibrous thermal conductive filler being oriented.

Inorganic Filler

The electromagnetic wave absorbing thermal conductive sheet may further contain an inorganic filler, in addition to the above-described binder resin and thermal conductive fillers. This further enhances the thermal conductivity of the electromagnetic wave absorbing thermal conductive sheet and improves the strength of the sheet The shape, material, average particle diameter, etc. of the inorganic filler are not limited, and may be selected as appropriate depending on the purpose. Examples of the shape include spherical, ellipsoidal, bulk, particulate, flat, and needle-like. Of these, spherical or elliptic shape is preferable in terms of filling property, and spherical shape is particularly preferable.

Examples of the material of the inorganic filler include aluminum nitride (AlN), silica, alumina (aluminum oxide), boron nitride, titania, glass, zinc oxide, silicon carbide, silicon, silicon oxide, aluminum oxide, and metal particles, These may be used alone or in combination of two or more. Of these, alumina, boron nitride, aluminum nitride, zinc oxide, and silica are preferable. In terms of thermal conductivity, alumina and aluminum nitride are particularly preferable.

The inorganic filler may be surface-treated. By treating the inorganic filler with a coupling agent as the surface treatment, the dispersibility of the inorganic fillers are improved, and the flexibility of the electromagnetic wave absorbing thermal conductive sheet is improved.

The average particle diameter of the inorganic filler may be selected as appropriate, depending on the type of the inorganic substance and the like.

In the case where the inorganic filler is alumina, its average particle diameter is preferably 1 μm to 10 μm, more preferably 1 μm to 5 μm, and particularly preferably 4 μm to 5 μm. If the average particle diameter is less than 1 μm, viscosity increases, which may hinder mixing. If the average particle diameter is more than 10 μm, the heat resistance of the thermal conductive sheet is likely to increase.

In the case where the inorganic filler is aluminum nitride, its average particle diameter is preferably 0.3 μm to 6.0 μm, more preferably 0.3 μm to 2.0 μm, and particularly preferably 0.5 μm to 1.5 μm. If the average particle diameter is less than 0.3 μm, viscosity increases, which may hinder mixing. If the average particle diameter is more than 6.0 μm, the heat resistance of the thermal conductive sheet is likely to increase.

The average particle diameter of the inorganic filler can be measured, for example, by a particle size analyzer or a scanning electron microscope (SEM).

Magnetic Metal Powder

The electromagnetic wave absorbing thermal conductive sheet preferably further contains magnetic metal powders, in addition to the above-described binder resin, fibrous thermal conductive fillers, and inorganic filler. As a result of the electromagnetic wave absorbing thermal conductive sheet containing the magnetic metal powders, the electromagnetic wave absorbency of the electromagnetic wave absorbing thermal conductive sheet can be improved.

The type of the magnetic metal powder is not limited as long as it has electromagnetic wave absorbency, and a known magnetic metal powder may be selected as appropriate. For example, an amorphous metal powder or a crystalline metal powder may be used. Examples of the amorphous metal powder include Fe—Si—B—Cr-based, Fe—Si—B-based, Co—Si—B-based, Co—Zr-based, Co—Nb-based, and Co—Ta-based. Examples of the crystalline metal powder include pure iron, Fe-based, Co-based, Ni-based, Fe—Ni-based, Fe—Co-based, Fe—Al-based, Fe—Si-based, Fe—Si—Al-based, and Fe—Ni—Si—Al-based. As the crystalline metal powder, a microcrystalline metal powder obtained by adding a trace amount of N (nitrogen), C (carbon), O (oxygen), B (boron), or the like to a crystalline metal powder for refinement may be used.

A mixture of two or more magnetic metal powders of different materials or different average particle diameters may be used.

The shape of the magnetic metal powders are preferably adjusted to be spherical, flat, or the like. For example, to increase the filling property, it is preferable to use spherical magnetic metal powders having a particle diameter of several μm to several ten μm. Such magnetic metal powders can be produced, for example, by an atomizing method or a method of thermally decomposing metal carbonyl. The atomizing method has an advantage that a spherical powder can be formed easily, and is a method of discharging molten metal from a nozzle and spraying a jet stream of air, water, inert gas, or the like to the discharge molten metal to solidify it as droplets, thus forming a powder. When producing amorphous magnetic metal powders by the atomizing method, the cooling rate is preferably about $1\times10^6$ (K/s), to prevent the molten metal from crystallization.

An amorphous alloy powder produced by the atomizing method has a smooth surface. By using such an amorphous alloy powder with low surface roughness and a small specific surface area as the magnetic metal powders, the filling property for the binder resin can be enhanced. The filling property can be further improved by performing coupling treatment.

The electromagnetic wave absorbing thermal conductive sheet may optionally contain other components depending on the purpose, in addition to the above-described binder resin, fibrous thermal conductive filler, inorganic fillers, and magnetic metal powders.

Examples of the other components include thixotropy-imparting agents, dispersants, curing accelerators, retarders, fine tackifiers, plasticizers, flame retardants, antioxidants, stabilizers, and colorants.

EXAMPLES

More detailed description will be given below by way of examples, although the present disclosure is not limited to these examples.

Example 1

Figure 5B:
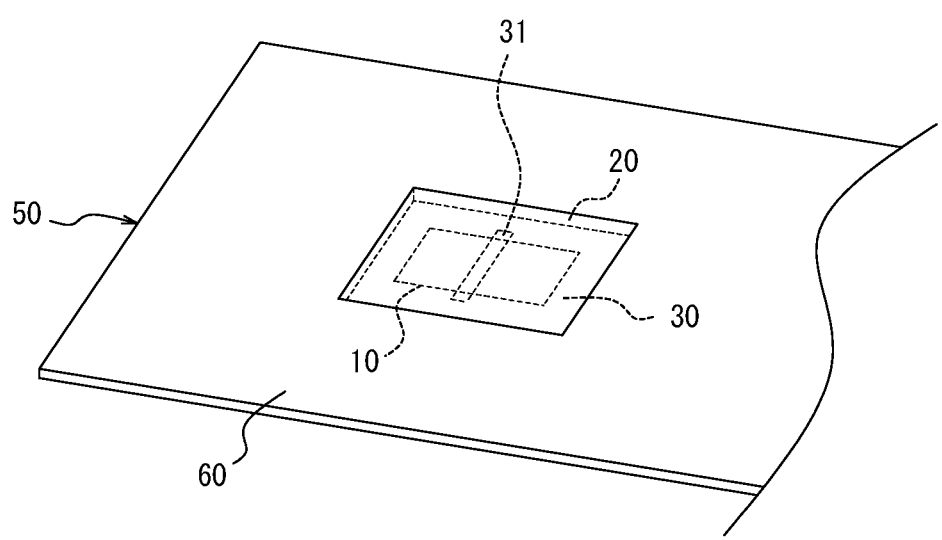
FIG. 5B is a back view schematically illustrating the model of a semiconductor device.

In Example 1, each analysis model of a semiconductor device as illustrated in FIGS. 5A and 5B was made using a 3D electromagnetic field simulator ANSYS HFSS (manufactured by ANSYS, Inc.), and its electromagnetic wave suppression effect was evaluated.

For the electromagnetic wave absorbing thermal conductive sheet 10 used in the model of a semiconductor device, two-component addition reaction type liquid silicone was used as a resin binder, Fe—Si—B—Cr amorphous magnetic particles with an average particle diameter of 5 μm was used as magnetic metal powders, and pitch-based carbon fibers ("thermal conductive fibers" manufactured by Nippon Graphite Fiber Corporation) with an average fiber length of 200 μm were used as fibrous thermal conductive fillers, which were dispersed at a volume ratio (two-component addition reaction type liquid silicone:amorphous magnetic particles:pitch-based carbon fibers) of 35 vol %:53 vol %:12 vol % to prepare a silicone composition (sheet composition). The resultant electromagnetic wave absorbing thermal conductive sheet had an average thermal conductivity in the vertical direction (the heat resistance at the interface and the heat resistance inside were calculated together) of 9.2 W/m·K as measured in accordance with ASTM D5470. As the magnetic characteristics and dielectric characteristics of the sheet, values measured by S-parameter method were used. The thickness T of the electromagnetic wave absorbing thermal conductive sheet 10 was 0.7 mm.

For the heatsink 40 used in the model of a semiconductor device, an aluminum plate was used as material, with a size of 60×120 mm and a thickness of 0.3 mm.

The shield can 20 was made of stainless steel with a thickness of 0.2 mm, with an outer diameter of 20 mm×20 mm×1.2 mm. The opening 21 was formed at its center. The size of the opening 21 was □10 mm (10 mm×10 mm).

FIGS. 5A and 5B are respectively a top view (upper side) and a back view (lower side) of the analysis model of a semiconductor device. In FIGS. 5A and 5B, each member constituting the semiconductor device is illustrated in a perspective view to indicate the positional relationships between the members. The sectional structure of the analysis model is the same as that in FIGS. 1 to 3. A microstripline (MSL) 31 covered with a resin mold was used as the semiconductor element 30, as illustrated in FIGS. 5A and 5B. The MSL 31 was obtained by providing a copper signal line (signal line size: 1 mm×14 mm×0.02 mm) on the front side of the dielectric substrate 50 (substrate size: 60 mm×120 mm×0.65 mm) and the ground 60 on the back side of the dielectric substrate 50. A signal source of the semiconductor element 30 was simplified as this MSL 31, with both ends being set as signal input and output ends. The body (the part molded with the resin) of the semiconductor element 30 was a dielectric having a relative permittivity of 4 and a dielectric loss tangent of 0.01. The size of the body of the semiconductor element 30 was 16 mm×16 mm×0.7 mm.

Figure 6:
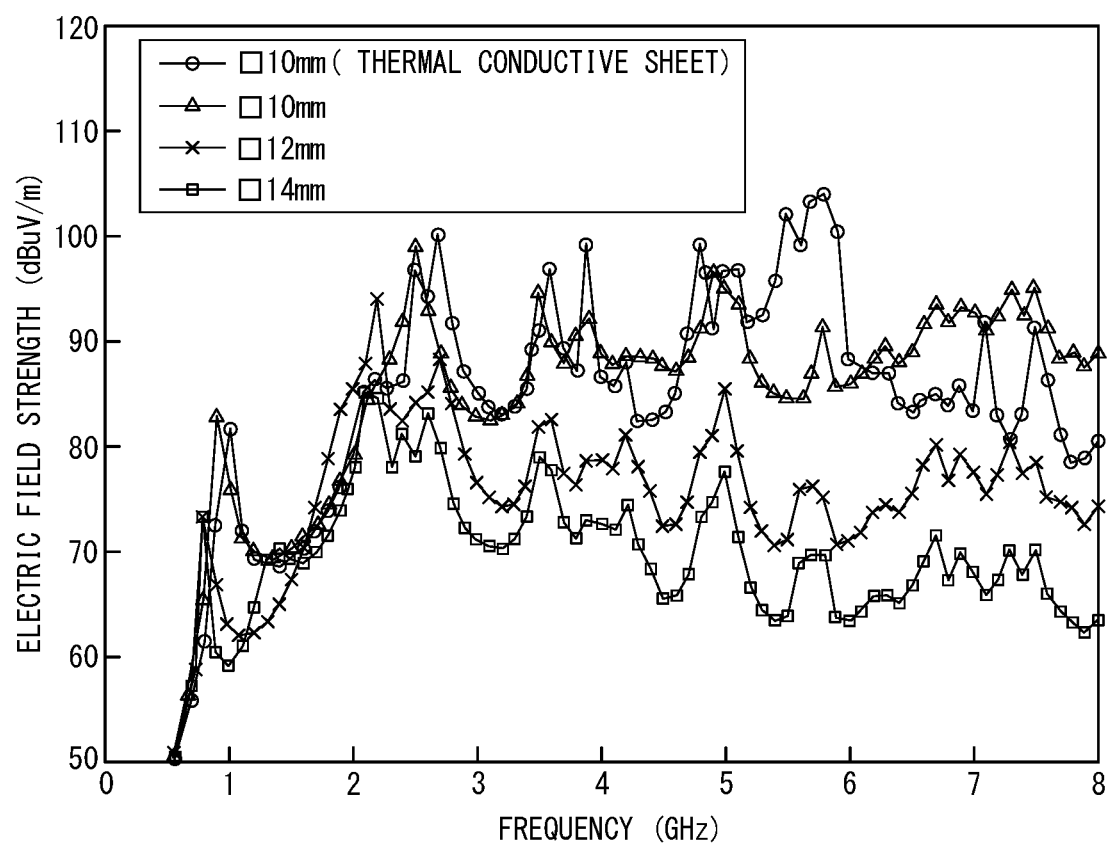
FIG. 6 is a graph illustrating the electric field strength depending on frequency of each electromagnetic wave absorbing thermal conductive sheet that differs in conditions according to Example 1.

In the evaluation of the electromagnetic wave suppression effect, the maximum electric field strength at a position of 3 m away from the semiconductor device was calculated, and indicated as the electric field strength (dB μV/m) depending on frequency. FIG. 6 illustrates the electric field strength calculation results.

In FIG. 6, "□10 mm" represents an analysis model using an electromagnetic wave absorbing thermal conductive sheet 10 having a covering area of 10 mm×10 mm same as the opening 21 to form a semiconductor device with the structure illustrated in FIG. 1. "□10 mm (thermal conductive sheet)" represents an analysis model using, instead of an electromagnetic noise-suppressing thermal conductive sheet, a thermal conductive sheet (relative permittivity:6, dielectric loss tangent: 0.01) having a covering area of 10 mm×10 mm but lower in electromagnetic wave absorption effect to form a semiconductor device with the structure illustrated in FIG. 1.

"□12 mm" represents an analysis model using an electromagnetic wave absorbing thermal conductive sheet 10 having a covering area of 12 mm×12 mm larger than the opening 21 to form a semiconductor device with the structure illustrated in FIG. 2. "□14 mm" represents an analysis model using an electromagnetic wave absorbing thermal conductive sheet 10 having a covering area of 14 mm×14 mm.

As can be seen from the results in FIG. 6, the analysis models of □10 mm, □12 mm, and −14 mm within the range of the present disclosure had higher electromagnetic wave suppression effect (electric field strength reduction) than the analysis model of □10 mm (thermal conductive sheet). In particular, the electromagnetic wave suppression effect was even higher with the structure (the analysis models of □12 mm and □14 mm) in which the electromagnetic wave absorbing thermal conductive sheet 10 covers part of the upper surface 20a and the lower surface 20b of the conductive shield can 20 as illustrated in FIG. 2.

Example 2

In Example 2, each analysis model of a semiconductor device as illustrated in FIGS. 5A and 5B was made using the 3D electromagnetic field simulator and its electromagnetic wave suppression effect was evaluated under the same conditions as in Example 1.

Figure 7:
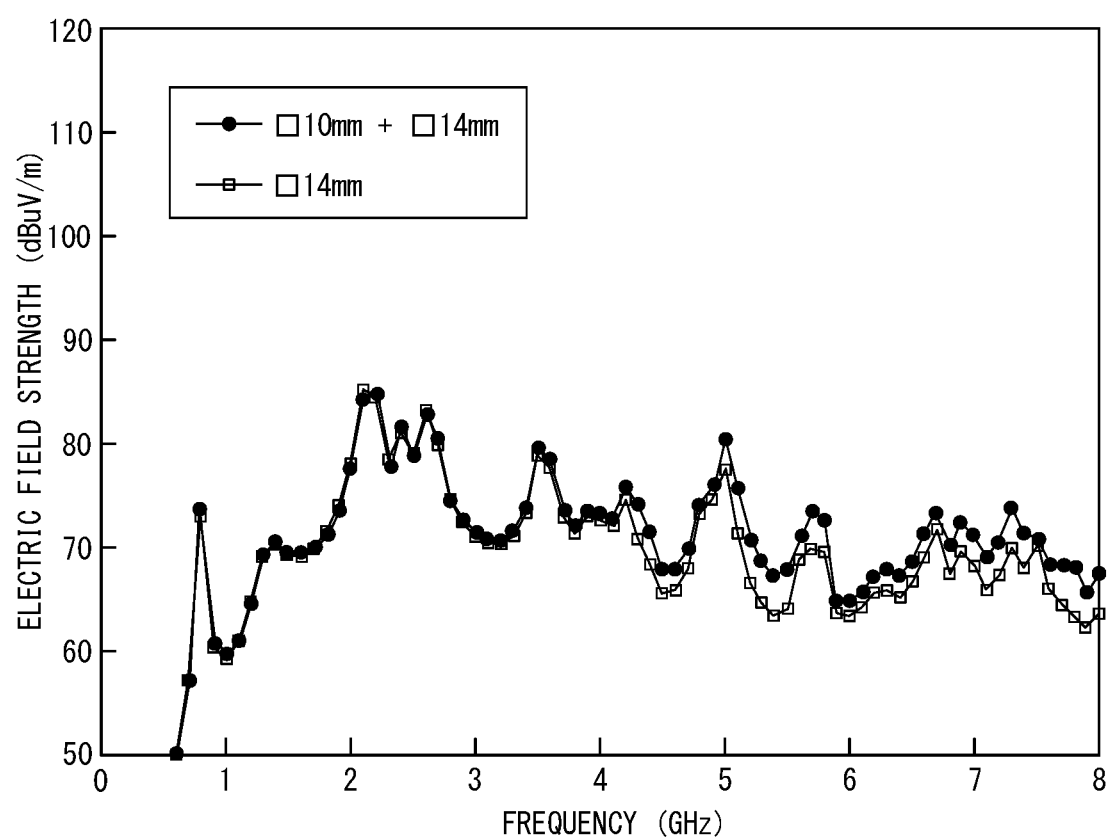
FIG. 7 is a graph illustrating the electric field strength depending on frequency of each electromagnetic wave absorbing thermal conductive sheet that differs in conditions according to Example 2.

In the evaluation of the electromagnetic wave suppression effect, the electric field strength (dBμV/m) depending on frequency was calculated in the same way as in Example 1. FIG. 7 illustrates the calculation results.

In FIG. 7, "□14 mm" represents an analysis model using an electromagnetic wave absorbing thermal conductive sheet 10 having a covering area of 14 mm×14 mm larger than the opening 21 to form a semiconductor device with the structure illustrated in FIG. 2.

"□10 mm+□14 mm" represents an analysis model using an electromagnetic wave absorbing thermal conductive sheet 10 made up of a combination of two sheets (a sheet having a covering area of 14 mm×14 mm (a sheet covering the upper surface 20a of the conductive shield can 20)+a sheet having a covering area of 10 mm×10 mm (a sheet contained in the opening)) to form a semiconductor device with the structure illustrated in FIG. 3.

As can be seen from the results in FIG. 7, the analysis models of □10 mm+□14 mm and □14 mm both had excellent electromagnetic wave suppression effect. This demonstrates that excellent electromagnetic wave suppression effect can be equally achieved both in the case where the electromagnetic wave absorbing thermal conductive sheet 10 is made up of one sheet and in the case where the electromagnetic wave absorbing thermal conductive sheet 10 is made up of a plurality of sheets.

Example 3

In Example 3, each analysis model of a semiconductor device as illustrated in FIGS. 5A and 5B was made using the 3D electromagnetic field simulator and its electromagnetic wave suppression effect was evaluated under the same conditions as in Example 1. Regarding the size of the opening 21 of the conductive shield can 20, the following two types were prepared: □10 mm: 10 mm×10 mm; and □14 mm: 14 mm×14 mm.

Figure 8:
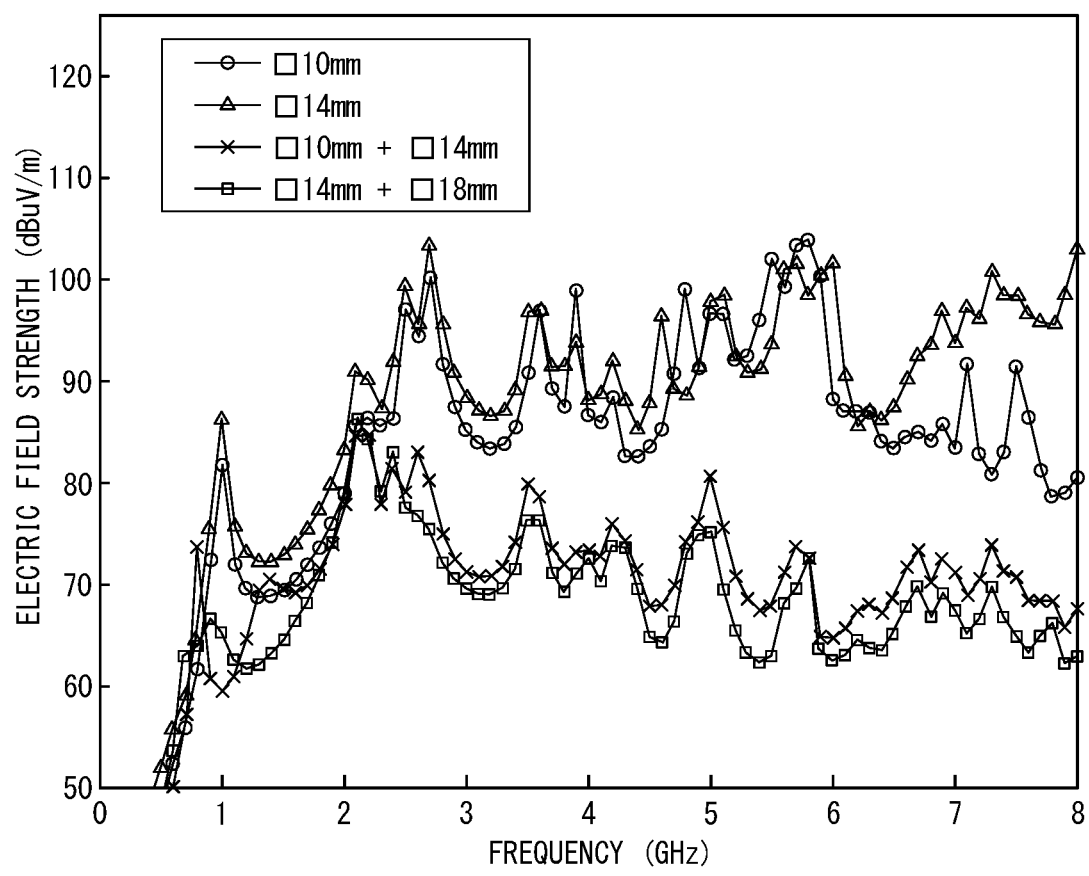
FIG. 8 is a graph illustrating the electric field strength depending on frequency of each electromagnetic wave absorbing thermal conductive sheet that differs in conditions according to Example 3.

In the evaluation of the electromagnetic wave suppression effect, the electric field strength (dBμV/m) depending on frequency was calculated. FIG. 8 illustrates the calculation results.

In FIG. 8, "□10 mm" represents an analysis model using an electromagnetic wave absorbing thermal conductive sheet 10 having a covering area of 10 mm×10 mm same as the opening 21 to form a semiconductor device with the structure illustrated in FIG. 1. "□14 mm" represents an analysis model using an electromagnetic wave absorbing thermal conductive sheet 10 having a covering area of 14 mm×14 mm same as the opening 21.

"□10 mm+□14 mm" represents an analysis model using an electromagnetic wave absorbing thermal conductive sheet 10 made up of a combination of two sheets (a sheet having a covering area of 14 mm×14 mm (a sheet covering the upper surface 20a of the conductive shield can 20)+a sheet having a covering area of 10 mm×10 mm (a sheet contained in the opening of −10 mm)) to form a semiconductor device with the structure illustrated in FIG. 3. "□14 mm+□18 mm" represents an analysis model using an electromagnetic wave absorbing thermal conductive sheet 10 made up of a combination of two sheets (a sheet having a covering area of 18 mm×18 mm (a sheet covering the upper surface 20a of the conductive shield can 20)+a sheet having a covering area of 14 mm×14 mm (a sheet contained in the opening of −14 mm)) to form a semiconductor device with the structure illustrated in FIG. 3.

As can be seen from the results in FIG. 8, the electromagnetic wave suppression effect was not significantly different between the case where the size of the opening 21 of the conductive shield can 20 was □10 mm and the case where the size of the opening 21 of the conductive shield can 20 was □14 mm. Given that the analysis models of □10 mm+□14 mm and □14 mm+□18 mm, which are analysis models of the semiconductor device illustrated in FIG. 3, exhibited higher electromagnetic wave suppression effect than the analysis models of □10 mm and □14 mm, it is important to provide the electromagnetic wave absorbing thermal conductive sheet 10 so as to at least cover part of the upper surface 20a of the conductive shield can 20.

INDUSTRIAL APPLICABILITY

It is thus possible to provide a semiconductor device having excellent heat transferring performance and electromagnetic wave suppression effect.

REFERENCE SIGNS LIST 1 semiconductor device
10 electromagnetic wave absorbing thermal conductive sheet
20 conductive shield can
20a upper surface of conductive shield can
20b lower surface of conductive shield can
21 opening
30 semiconductor element
31 MSL
40 cooling member
50 substrate
51 land
60 ground
100 conventional semiconductor device
S covering area of electromagnetic wave absorbing thermal conductive sheet
T thickness of electromagnetic wave absorbing thermal conductive sheet

The invention claimed is:

1. A semiconductor device comprising:
a semiconductor element formed on a substrate;
a conductive shield can having an opening, covering at least a part of the semiconductor element, and connected to a ground;
a cooling member located above the conductive shield can; and
an electromagnetic wave absorbing thermal conductive sheet formed between the semiconductor element and the cooling member at least through the opening of the conductive shield can,
wherein the electromagnetic wave absorbing thermal conductive sheet covers part of at least one of an upper surface and a lower surface of the conductive shield can and a covering area of the electromagnetic wave absorbing thermal conductive sheet is larger than an area of the opening of the conductive shield can, and
the electromagnetic wave absorbing thermal conductive sheet has higher thermal conductivity in a sheet central portion than in a sheet peripheral portion.

2. The semiconductor device according to claim 1, wherein the electromagnetic wave absorbing thermal conductive sheet covers part of the upper surface of the conductive shield can.

3. The semiconductor device according to claim 1, wherein the electromagnetic wave absorbing thermal conductive sheet covers part of each of the upper surface and the lower surface of the conductive shield can.

4. The semiconductor device according to claim 1, wherein the electromagnetic wave absorbing thermal conductive sheet is made up of a plurality of sheets.

5. The semiconductor device according to claim 1, wherein the electromagnetic wave absorbing thermal conductive sheet contains fibrous thermal conductive fillers.

6. The semiconductor device according to claim 5, wherein the fibrous thermal conductive fillers are carbon fibers.

7. The semiconductor device according to claim 6, wherein the electromagnetic wave absorbing thermal conductive sheet further contains magnetic metal powders.

* * * * *